United States Patent [19]

Chesebro et al.

[11] Patent Number: 4,519,128

[45] Date of Patent: May 28, 1985

[54] METHOD OF MAKING A TRENCH ISOLATED DEVICE

[75] Inventors: Donald G. Chesebro, Colchester; Francis J. Soychak, Essex Junction, both of Vt.

[73] Assignee: International Business Machines Corporation, Armonk, N.Y.

[21] Appl. No.: 539,193

[22] Filed: Oct. 5, 1983

[51] Int. Cl.³ .......................................... H01L 21/76
[52] U.S. Cl. ................................... 29/576 W; 29/578; 357/54
[58] Field of Search .............. 29/576 W, 578; 357/47, 357/49, 52, 54

[56] References Cited

U.S. PATENT DOCUMENTS

| | | | |
|---|---|---|---|
| 3,385,729 | 5/1968 | Larchian | 117/200 |
| 4,047,195 | 9/1977 | Allison | 357/49 |
| 4,048,649 | 9/1977 | Bohn | 357/43 |
| 4,110,779 | 8/1978 | Rathbone et al. | 357/34 |
| 4,174,252 | 11/1979 | Kressel | 156/653 |
| 4,242,156 | 12/1980 | Peel | 148/175 |
| 4,271,583 | 6/1981 | Kahng et al. | 29/576 W |
| 4,396,460 | 8/1983 | Tamaki et al. | 357/49 |

OTHER PUBLICATIONS

Schaible et al., IBM Tech. Discl. Bul., "Forming Sidewall Dielectric Isolation of Integrated Circuit Devices", pp. 2893–2894, 3/75.

Antipov, IBM Tech. Discl. Bul., "Prevention of Birdsbeak Formation", pp. 4917–4919, 4/81.

Hulvey et al., IBM Tech. Discl. Bul., "Dielectric Isolation Process", pp. 5458–5459, 4/82.

Primary Examiner—Brian E. Hearn
Assistant Examiner—Hunter L. Auyang
Attorney, Agent, or Firm—Stephen J. Limanek

[57] ABSTRACT

A method is provided for making a semiconductor device which includes the steps of forming a first insulating layer on the surface of a semiconductor layer having a given conductivity type, forming an opening in the insulating layer and forming a diffusion region of a conductivity type opposite to that of the given conductivity type at the surface of the semiconductor layer to provide a P-N junction below the surface of the semiconductor layer. A trench is then formed along a given axis in the semiconductor layer having a sidewall passing through the opening and through the P-N junction. A second layer of insulation is formed on the sidewall of the trench, on the first insulating layer and through the opening onto the diffusion region. The second layer of insulation is etched in the direction of the given axis until substantially all of the second layer of the insulation is removed from the opening, and an electrical contact is formed on the diffusion region within the opening. In a preferred embodiment of the invention, the second layer is a dual insulating layer which may include a layer of silicon dioxide grown on the semiconductor layer and a layer of silicon nitride deposited on the layer of silicon dioxide.

15 Claims, 4 Drawing Figures

METHOD OF MAKING A TRENCH ISOLATED DEVICE

DESCRIPTION

1. Technical Field

This invention relates to a method of making integrated semiconductor devices and circuits and more particularly to a method of making trench isolated bipolar transistors.

2. Background Art

Trenches filled with insulating material, such as polyimide, for isolating devices, e.g., transistors, in integrated semiconductor circuits have been known to provide significant device or transistor density improvements over other known isolation techniques.

In IBM Technical Disclosure Bulletin, Vol. 24, No. 11A April, 1982, pp. 5458-5459, there is disclosed an NPN transistor having an emitter butted against the sidewall of a trench filled with insulating material. Filling a trench with silicon dioxide and silicon nitride is shown in IBM Technical Disclosure Bulletin Vol. 23, No. 11 April, 1981, pp. 4917-4919, with portions of the silicon nitride being removed by a reactive ion etching (RIE) technique. Filling a V-groove trench with polyimide is taught in IBM Technical Disclosure Bulletin, Vol. 17, No. 10 March, 1975, pp. 2893-2894.

U.S. Pat. No. 3,385,729, filed on Oct. 26, 1964, by G. A. Larchian, discloses an isolation trench having a sidewall covered first with a layer of silicon dioxide and then with a layer of silicon nitride, and U.S. Pat. No. 4,242,156, filed on Oct. 15, 1979, by J. L. Peel, teaches the formation of a silicon nitride layer over a silicon dioxide layer on a sidewall to prevent oxide breakdown.

In U.S. Pat. No. 4,048,649, filed on Feb. 6, 1976, by R. Bohn, there is shown a base of a transistor butted against a V-groove trench lined with a layer of silicon dioxide on which is formed a layer of silicon nitride, and in U.S. Pat. No. 4,174,252, filed on July 26, 1978, by H. Kressel et al, there is disclosed an emitter of a transistor protected on a sidewall by a layer of oxygen doped polysilicon over which is formed a layer of silicon nitride with a contact opening formed in the central portion of the top surface of the emitter.

An emitter of a transistor butted against a silicon dioxide region with an emitter contact overlapping the silicon dioxide region is illustrated in U.S. Pat. No. 4,110,779, filed on Dec. 13, 1976, by R. Rathbone et al.

DISCLOSURE OF THE INVENTION

It is an object of this invention to provide an improved method for making very small semiconductor devices in a semiconductor substrate with electrical contacts without causing a short at a P-N junction located near the surface of the substrate.

In accordance with the teachings of this invention a method is provided for making a semiconductor device which includes the steps of forming a first insulating layer on the surface of a semiconductor layer having a given conductivity type, forming an opening in the insulating layer and forming a diffusion region of a conductivity type opposite to that of the given conductivity type at the surface of the semiconductor layer to provide a P-N junction below the surface of the semiconductor layer. A trench is then formed in the semiconductor layer having a sidewall located along a given plane through the opening and through the P-N junction. A second layer of insulation is formed within the opening and on the sidewall of the trench including the diffusion region and P-N junction. The second layer of insulation is etched substantially in the direction of the given plane until substantially all of the second layer of the insulation is removed from the opening and a contact is formed on a clean surface of the diffusion region within the opening.

In a preferred embodiment of the invention, the second layer of insulation is a dual insulating layer which may include a layer of silicon dioxide grown on the semiconductor layer and a layer of silicon nitride deposited on the layer of silicon dioxide.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
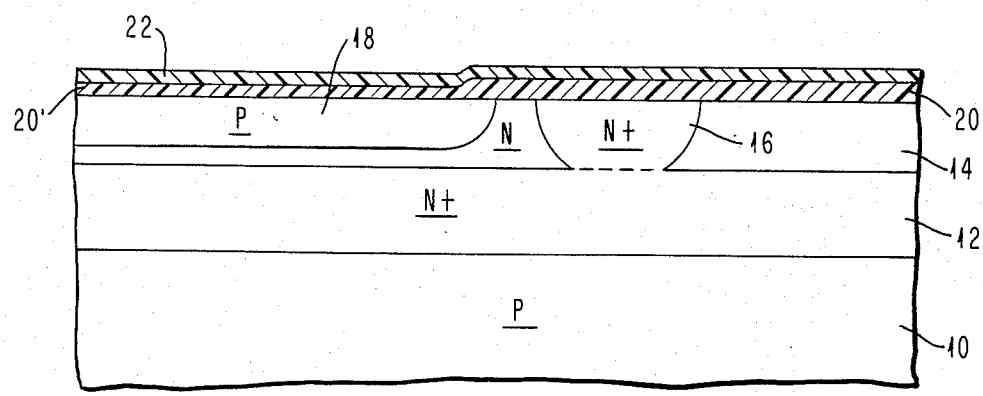
FIGS. 1-4, are sectional views of a trench isolated bipolar transistor taken at various stages during the fabrication of the transistor in accordance with the method of the present invention.

Referring to the drawings in more detail there is illustrated in sectional view in FIG. 1 a structure for forming the trench isolated transistor during early stages of the method of the present invention. The structure includes a semiconductor substrate 10, preferably made of silicon, having a P type conductivity and an N+ conductivity type subcollector diffusion region 12 formed in any known manner preferably with the use of arsenic. A known epitaxial layer 14 having An N− type conductivity is grown on the substate 10 with an N+ reach-through region 16 formed between the surface of the epitaxial layer 14 and the subcollector diffusion region 12 preferably with the use of phosphorous. A P conductivity type base region 18, spaced from N+ region 16, is formed at the surface of the epitaxial layer 14 with the use of a boron diffusion or implantation. The regions 16 and 18 are formed after a layer of silicon dioxide 20 having a thickness of about 3000 angstroms is grown on the surface of the epitaxial layer 14 and appropriate openings are made in layer 20 with subsequent reoxidation. Since the oxide growth rate is slower over the base region 18 than over the N+ reach-through region 16, silicon dioxide layer 20 has a thinner segment 20', about 2000 angstroms, over the base region 18. A layer of silicon nitride 22 having a thickness of approximately 850 angstroms is deposited over the silicon dioxide layer 20, including segment 20'.

Figure 2:
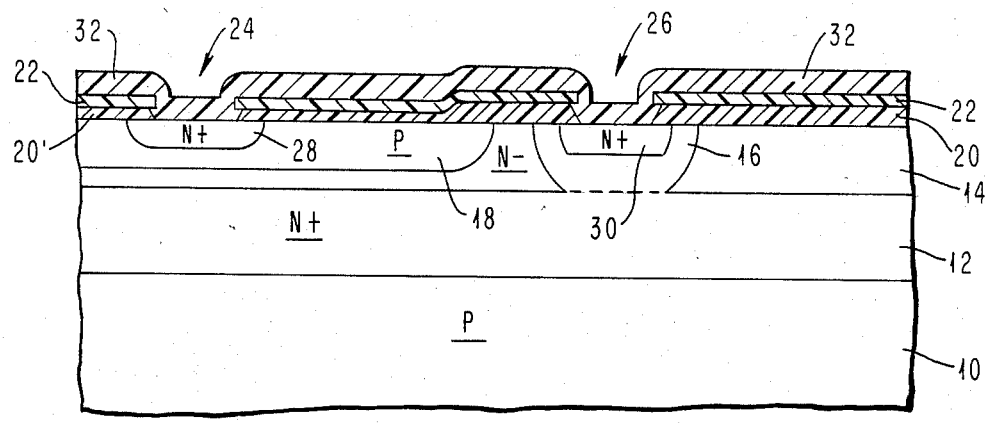

Openings 24 and 26 are made in the silicon dioxide layer 20,20' and in the silicon nitride layer 22 for forming an N+ emitter region 28 in the base region 18 and an N+ contact region 30 for reach-through region 16 by any known arsenic diffusion technique, as indicated in FIG. 2 of the drawings. A 6000 angstrom layer of silicon dioxide 32 is pyrolytically deposited over the silicon nitride layer 22 and into openings 24 and 26.

Figure 3:
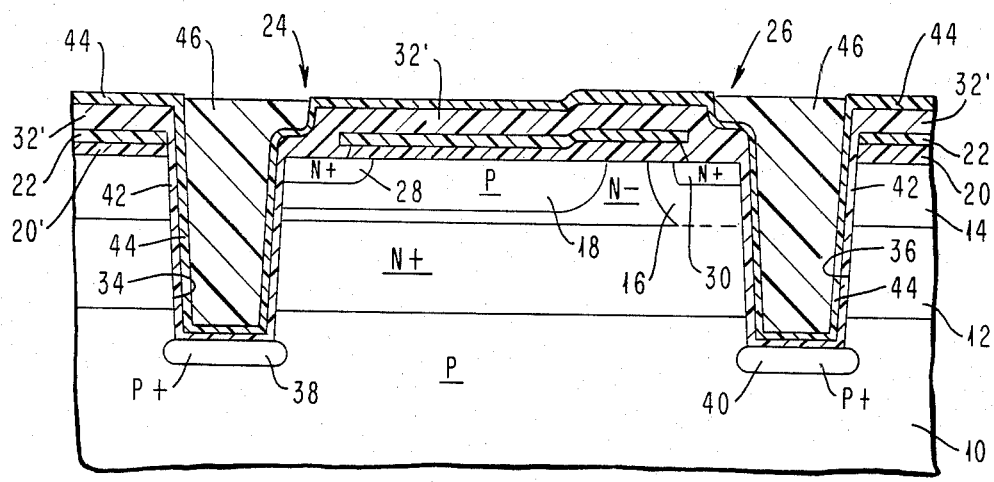

By using an appropriately patterned photoresist mask, not shown, and known reactive ion etching (RIE) techniques, trenches 34 and 36 are formed through the epitaxial layer 14 and the N+ subcollector region 12 to the P conductivity type substrate 10, as shown in FIG. 3. A first reactive ion etching step is performed using carbon tetrafluoride gas (CF$_4$) to etch through the 6000 angstrom layer of silicon dioxide 32, the 850 angstrom layer of silicon nitride 22 and the 3000 and 2000 angstrom layer of silicon dioxide 20 and 20', respectively. The photoresist is then removed and a second reactive ion etching step is performed in a direction perpendicular to the surface of the epitaxial layer 14 using carbon-chlorine-fluorine, (CCl$_2$F$_2$) plus oxygen gas to etch trenches 34 and 36 through epitaxial layer 14, subcollector region 12 and P conductivity type substrate 10 to a depth of approximately 4.5 to 5.0 micrometers. During this second etching step, the silicon dioxide layer 32 is used as a masking material to protect all other regions and is reduced to approximately 1500 angstroms.

After appropriately cleaning out the trenches 34 and 36, a thin layer of silicon dioxide, approximately 250 angstroms, is grown on the sidewalls and bottom or floor of the trenches 34 and 36. Channel stop regions 38 and 40 are formed at the bottom or floor of trenches 34 and 36, respectively, by implanting boron ions at an energy of about 7.5 Kev and dose of $5 \times 10^{13}$ per square centimeter at a normal incidence to the surface of the epitaxial layer 14. After P+ channel stop regions 38 and 40 are formed, a 1500 angstrom layer of silicon dioxide 42 is pyrolytically deposited on the sidewalls and bottom of trenches 34 and 36 and onto the remaining silicon dioxide layer 32 forming a combined silicon dioxide layer 32' illustrated in FIG. 3. A layer of silicon nitride 44 having a thickness of 500 angstroms is deposited over the silicon dioxide layer 42 within trenches 34 and 36 and over the silicon dioxide layer 32'.

By using known spinning techniques, the trenches 34 and 36 are filled with an insulating material, preferably, polyimide 46, and any excess polyimide is removed, after being thermally cured, by known etch back techniques to at least the surface of the silicon nitride layer 44.

Figure 4:
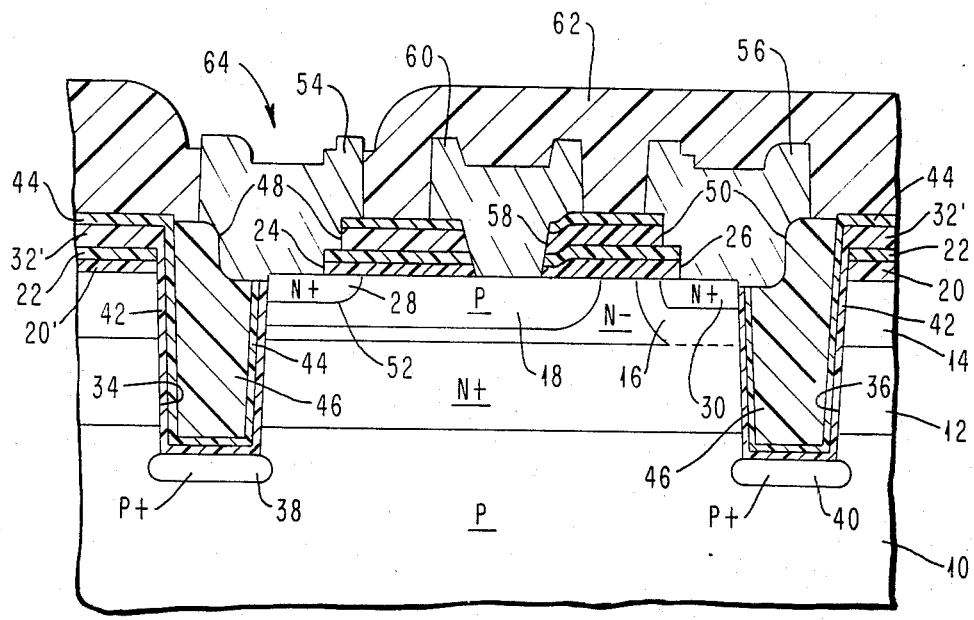

A block mask and photoresist layer, not shown, are used to define openings 48 and 50 over the emitter region 28 and the reach-through contact region 30, respectively, as shown in FIG. 4 of the drawings. Openings 48 and 50 are formed by reactivity ion etching with oxygen 3000 angstroms of polyimide 46 and with carbon tetrafluoride 500 angstroms of silicon nitride layer 44 and 1000 angstroms of silicon dioxide layer 32'. With a wet etch, preferably a 7 to 1 ratio of buffered hydrofluoric acid (BHF), the remaining thickness of silicon dioxide layer 32' is removed. Alternatively, other highly selective etching techniques could be used which have the capability to remove silicon dioxide with substantially little removal of silicon nitride or silicon. The photoresist layer is then stripped off with, preferably, hot n-methyl pyrillidone (NMP). It should be noted that the opening 48 is formed over the emitter region 28 and overlaps onto the polyimide 46 along with interposed edges of silicon dioxide layer 42 and silicon nitride layer 44 in the trench 34. Since a reactive ion etch is used to remove the silicon nitride layer 44 within the opening 48 all of the silicon nitride above the emitter region 28 is removed while little or none of the silicon nitride is removed from the silicon nitride layer 44 located in the trench 34. Thus, it can be seen that the silicon nitride remains in the trench 34 to protect the P-N junction 52 even when a wet etch is used to remove all of the remaining silicon dioxide layer 32' located over the emitter region 28. Furthermore, it can be seen that the P-N junction 52 can be placed very close to the surface of the epitaxial layer 14 without being shorted by an emitter contact metal 54, shown in FIG. 4, formed on emitter region 28. A collector or reach-through contact metal 56, also shown in FIG. 4, is formed in contact with the reach-through contact region 30. Contact metals 54 and 56 may be made of aluminum doped with copper and silicon.

Another mask and photoresist layer, not shown, are used to define a contact hole or opening 58 for the base region 18. Opening 58 is formed by reactively ion etching with carbon tetrafluoride gas through 500 angstroms of silicon nitride layer 44, approximately 3000 angstroms of silicon dioxide layer 32', 850 angstroms of silicon nitride layer 22 and about 2000 angstroms of silicon dioxide layer 20'. The photoresist layer is then stripped off with hot NMP. After appropriate cleaning in opening 58, a base contact metal 60, also preferably made of aluminum doped with copper and silicon, is formed on base region 18.

With contact metals 54, 56 and 60 in place, a suitable passivating layer 62, such as a layer of polyimide, may be deposited over the structure with appropriate openings, such as opening 64, formed to receive any desired second level of metal.

It should be understood that although a bipolar transistor has been illustrated herein, the method of this invention may be used to form other devices, e.g., diodes or field effect transistors, which are isolated by a trench and have a shallow P-N junction butted against the sidewall of the trench. Furthermore, it should be understood that materials and conductivity types other than those disclosed herein may be used in the practice of this invention.

It can be seen that a method has been disclosed in accordance with the teachings of this invention which provides a very small and reliable isolated device having a P-N junction spaced a short distance from a contact metal which is self-aligned with one of the semiconductor regions, such as an emitter, forming the P-N junction.

It can also be seen that the invention as described provides a continuous layer 44 of silicon nitride passivation over all surfaces of the semiconductor structure except for contact hole openings, affording enhanced protection from ionic contaminants, and also that this method of trench sidewall insulation provides a means of avoiding depletion of boron dopant in the butted base region by virtue of the minimal thickness, i.e., 250 angstroms, of thermally grown silicon dioxide formed on trench sidewalls prior to the formation of the remaining pyrolytically deposited oxide to form layer 42. This method enhances the ability to form butted NPN emitters without sidewall electrical leakage to the collector region.

While the invention has been particularly shown and described with reference to preferred embodiments thereof, it will be understood by those skilled in the art that various changes in form and details may be made therein without departing from the spirit and scope of the invention.

What is claimed is:

1. A method of making a semiconductor device which includes the steps of:

forming a first layer of insulation on the surface of a semiconductor layer having a given conductivity type, forming an opening in said first layer of insulation, forming a diffusion region of a conductivity type opposite to that of said given conductivity type at the surface of said semiconductor layer through said opening to provide a P-N junction below the surface of said semiconductor layer, forming in said semiconductor layer a trench having a sidewall located along a given plane through said opening and through said P-N junction, forming a second layer of insulation on the sidewall of said trench, on said first layer of insulation and within said opening over said diffusion region, etching with a dry etching process said second layer of insulation substantially only in the direction of said given plane to remove from said opening at least a portion of said second layer of insulation, and forming an ohmic contact on said diffusion region within said opening.

2. A method of set forth in claim 1 wherein each of said first and second layers of insulation is a dual insulating layer including silicon dioxide and silicon nitride.

3. A method as set forth in claim 1 wherein said etching is performed with an etchant that preferentially etches said second layer of insulation.

4. A method as set forth in claim 3 further including the step of filling said trench with polyimide after forming said second layer of insulation.

5. A method as set forth in claim 1 wherein said etching is performed by a reactive ion etching process.

6. A method of making a semiconductor device which includes the steps of:

forming a given layer of insulation on the surface of a semiconductor layer having a given conductivity type, forming an opening in said given layer of insulation, forming a diffusion region of a conductivity type opposite to that of said given conductivity type through said opening to provide a P-N junction below the surface of said semiconductor layer, forming in said semiconductor layer a trench having a sidewall passing through said opening and through said P-N junction, forming a first layer of insulation and a subsequent second layer of insulation on the sidewall of said trench, on said given layer of insulation and through said opening on said diffusion region, etching with a dry etching process said second layer of insulation substantially only in a direction parallel to the sidewall of said trench until substantially all of said second layer of insulation is removed from said opening, and forming an ohmic contact on said diffusion region.

7. A method as set forth in claim 6 wherein said first layer of insulation is silicon dioxide and said second layer is silicon nitride.

8. A method as set forth in claim 7 wherein said given layer of insulation is a dual layer including a layer of silicon dioxide and a layer of silicon nitride.

9. A method as set forth in claim 7 wherein said first insulation layer of silicon dioxide is formed on the sidewall of said trench and said second insulation layer of silicon nitride is formed on said first insulation layer of silicon dioxide.

10. A method as set forth in claim 9 wherein said first insulation layer of silicon dioxide is formed by growing a layer of silicon dioxide on the sidewall of said trench and then depositing a layer of silicon dioxide on said grown layer of silicon dioxide.

11. A method as set forth in claim 10 wherein said deposited layer of silicon dioxide is pyrolytically deposited.

12. A method as set forth in claim 6 wherein the etching of said first layer is performed with an etchant that preferentially etches said first layer of insulation.

13. A method as set forth in claim 6 further including a step of filling said trench with polyimide after forming said second layer of insulation.

14. A method as set forth in claim 6 wherein said etching is performed by a reactive ion etching process.

15. A method as set forth in claim 14 wherein said first layer of insulation is etched by a wet etching process after said reactive ion etching process is completed.

* * * * *